United States Patent
Kim et al.

(10) Patent No.: US 9,947,898 B2
(45) Date of Patent: Apr. 17, 2018

(54) DISPLAY DEVICE HAVING IMPROVED ENVIRONMENTAL TOLERANCE

(71) Applicant: Samsung Display Co., Ltd., Yongin-Si, Gyeonggi-Do (KR)

(72) Inventors: Sangki Kim, Yongin-si (KR); Donghyun Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/448,298

(22) Filed: Mar. 2, 2017

(65) Prior Publication Data
US 2017/0365814 A1 Dec. 21, 2017

(30) Foreign Application Priority Data
Jun. 16, 2016 (KR) ........................ 10-2016-0075099

(51) Int. Cl.
*H01L 51/52* (2006.01)
*H01L 27/32* (2006.01)

(52) U.S. Cl.
CPC ...... *H01L 51/5256* (2013.01); *H01L 27/3276* (2013.01)

(58) Field of Classification Search
CPC ............. H01L 51/5256; H01L 51/5253; H01L 27/3246; H01L 27/3297; H01L 27/3276; H01L 27/3258; H01L 2224/83051; H01L 2227/32
See application file for complete search history.

(56) References Cited

U.S. PATENT DOCUMENTS

| | | | | |
|---|---|---|---|---|
| 9,151,998 B2* | 10/2015 | Jung | ................ | G02F 1/133788 |
| 9,207,494 B2* | 12/2015 | Lee | ................ | G02F 1/1337 |
| 9,391,296 B2* | 7/2016 | Park | ................ | H01L 51/5253 |
| 9,415,576 B2* | 8/2016 | Seo | ................ | B32B 37/1284 |
| 9,434,144 B2* | 9/2016 | Kim | ................ | B32B 37/1292 |
| 2005/0155704 A1* | 7/2005 | Yokajty | ................ | H01L 51/5246 156/295 |
| 2011/0151612 A1* | 6/2011 | Dings | ................ | H01L 27/1214 438/69 |
| 2013/0342889 A1* | 12/2013 | Kim | ................ | G02B 26/005 359/290 |
| 2015/0060806 A1* | 3/2015 | Park | ................ | H01L 51/5253 257/40 |
| 2016/0020427 A1* | 1/2016 | Cho | ................ | H01L 51/5256 257/40 |

(Continued)

FOREIGN PATENT DOCUMENTS

KR 10-2015-0024471 A 3/2015
KR 10-2015-0025994 A 3/2015
(Continued)

*Primary Examiner* — Mohsen Ahmadi
(74) *Attorney, Agent, or Firm* — Innovation Counsel LLP

(57) ABSTRACT

A display device includes a substrate including a display area and a non-display area surrounding the display area, a thin-film encapsulation layer disposed on the substrate, and a first blocking dam disposed outside the display area, the first blocking dam having at least one layer. Portions of the first blocking dam is removed, and thus, the divided pieces of the first blocking dam are spaced apart from each other, and a second blocking dam is disposed in at least one of a front portion and a rear portion of the first blocking dam corresponding to the spaced part.

14 Claims, 5 Drawing Sheets

(56) References Cited

U.S. PATENT DOCUMENTS

| | | | |
|---|---|---|---|
| 2016/0035996 A1* | 2/2016 | Sun | H01L 21/77 257/40 |
| 2017/0033312 A1* | 2/2017 | Kim | H01L 51/5253 |
| 2017/0125734 A1* | 5/2017 | Lee | H01L 27/3246 |

FOREIGN PATENT DOCUMENTS

| KR | 10-2015-0027407 A | 3/2015 |
|---|---|---|
| KR | 10-2016-0011310 A | 2/2016 |

* cited by examiner

DISPLAY DEVICE HAVING IMPROVED ENVIRONMENTAL TOLERANCE

CROSS-REFERENCE TO RELATED APPLICATION

This application claims the benefit of Korean Patent Application No. 10-2016-0075099 filed on Jun. 16, 2016 in the Korean Intellectual Property Office, the disclosure of which is incorporated herein in its entirety by reference.

BACKGROUND

1. Field

One or more embodiments relate generally to display devices. More specifically, one or more embodiments relate to display devices having improved environmental tolerance.

2. Description of the Related Art

In general, a display device may be used in mobile apparatuses such as smart phones, laptop computers, digital cameras, camcorders, mobile information terminals, and tablet personal computers, and electronic apparatuses such as desktop computers, TV sets, outdoor advertisement panels, exhibition display devices, vehicle dashboards, and head-up displays (HUDs).

Recently, slimmer display devices have been developed.

Additionally, a flexible display device is easy to carry and may be applied to apparatuses having various shapes. A flexible display device based on an organic light-emitting display technology may be one of the most attractive flexible display devices. The flexible display device may be bent along one or more directions.

However, outside air and moisture may permeate into a display area of a display device due to external impact.

SUMMARY

One or more embodiments include a display device having improved resistance to outside air and moisture.

Additional aspects will be set forth in part in the description which follows and will be apparent from the description, or may be learned by practice of the presented embodiments.

According to one or more embodiments, a display device includes a substrate including a display area and a non-display area surrounding the display area, a thin-film encapsulation layer disposed on the substrate, and a first blocking dam disposed outside the display area, the first blocking dam having at least one layer. Portions of the first blocking dam are spaced apart from each other with a gap therebetween, and a second blocking dam is disposed to correspond to at least one of a front portion and a rear portion of the gap in the first blocking dam.

The first blocking dam may have one of at least one layer of an organic film structure, at least one layer of an inorganic film structure, and a laminated structure including at least one layer of an organic film and at least one layer of an inorganic film.

The first blocking dam may surround the display area.

The second blocking dam may have one of at least one layer of an organic film structure, at least one layer of an inorganic film structure, and a laminated structure including at least one layer of an organic film and at least one layer of an inorganic film.

The second blocking dam may be disposed between the display area and the first blocking dam, a first sidewall of the second blocking dam may face the display area, and a second sidewall of the second blocking dam may face the gap in the first blocking dam.

The second blocking dam may have a length greater than the gap, and one end of the second blocking dam may overlap a first end of the first blocking dam adjacent to one end of the gap, an opposing end of the second blocking dam may overlap a second end of the first blocking dam adjacent to an opposing end of the gap, so that the second blocking dam may extend beyond both the one end of the gap and the opposing end of the gap.

The second blocking dam may have an island shape.

The second blocking dam may surround the display area.

The second blocking dam may be disposed at both the front portion and the rear portion of the first blocking dam.

The display area may include a thin-film transistor including a semiconductor active layer, a gate electrode, a source electrode, and a drain electrode; a display device connected to the thin-film transistor; and at least one organic film. A plurality of voltage supply lines may be disposed in the non-display area, at least one organic film may be disposed on the display area, and the first and second blocking dams may be spaced apart from each other.

The voltage supply lines may include first and second voltage supply lines to which different voltages are respectively applied, the first and second voltage supply lines may have an interval therebetween, and a connector may connect the organic film and the first blocking dam is disposed in the interval.

The connector may cross a separation area not having the organic film.

The second blocking dam may be disposed in the separation area.

The second blocking dam may be disposed between the organic film and the first blocking dam, a first sidewall of the second blocking dam may face the organic film disposed on the display area, and a second sidewall of the second blocking dam may face the gap in the first blocking dam.

The first voltage supply line may include a first main line corresponding to the display area; and a first connection line extending from the first main line in a first direction, the second voltage supply line may include a second main line surrounding remaining areas of the display area; and a second connection line extending from the second main line in the first direction, and the interval may be positioned between the first and second connection lines.

The second blocking dam may have an island shape.

The second blocking dam may surround the display area.

The first blocking dam may comprise a same material as that of at least one of a gate insulating layer, an interlayer insulating layer, a planarization film, a pixel-defining layer, and a spacer, and the organic films may be laminated successively in a direction perpendicular to the substrate.

The second blocking dam may be at the same layer as at least one of the gate insulating layer, the interlayer insulating layer, the planarization film, the pixel-defining layer, and the spacer.

According to one or more embodiments, a display device includes a substrate including a display area and a non-display area surrounding the display area, a thin-film encapsulation layer disposed on the substrate, and a first blocking dam disposed outside the display area, the first blocking dam having at least one layer. Portions of the first blocking dam are spaced apart from each other with a gap therebetween, a second blocking dam is disposed to correspond to at least one of a front portion and a rear portion of a gap in the first blocking dam, and the second blocking dam surrounds the display area.

The first blocking dam may surround the display area.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
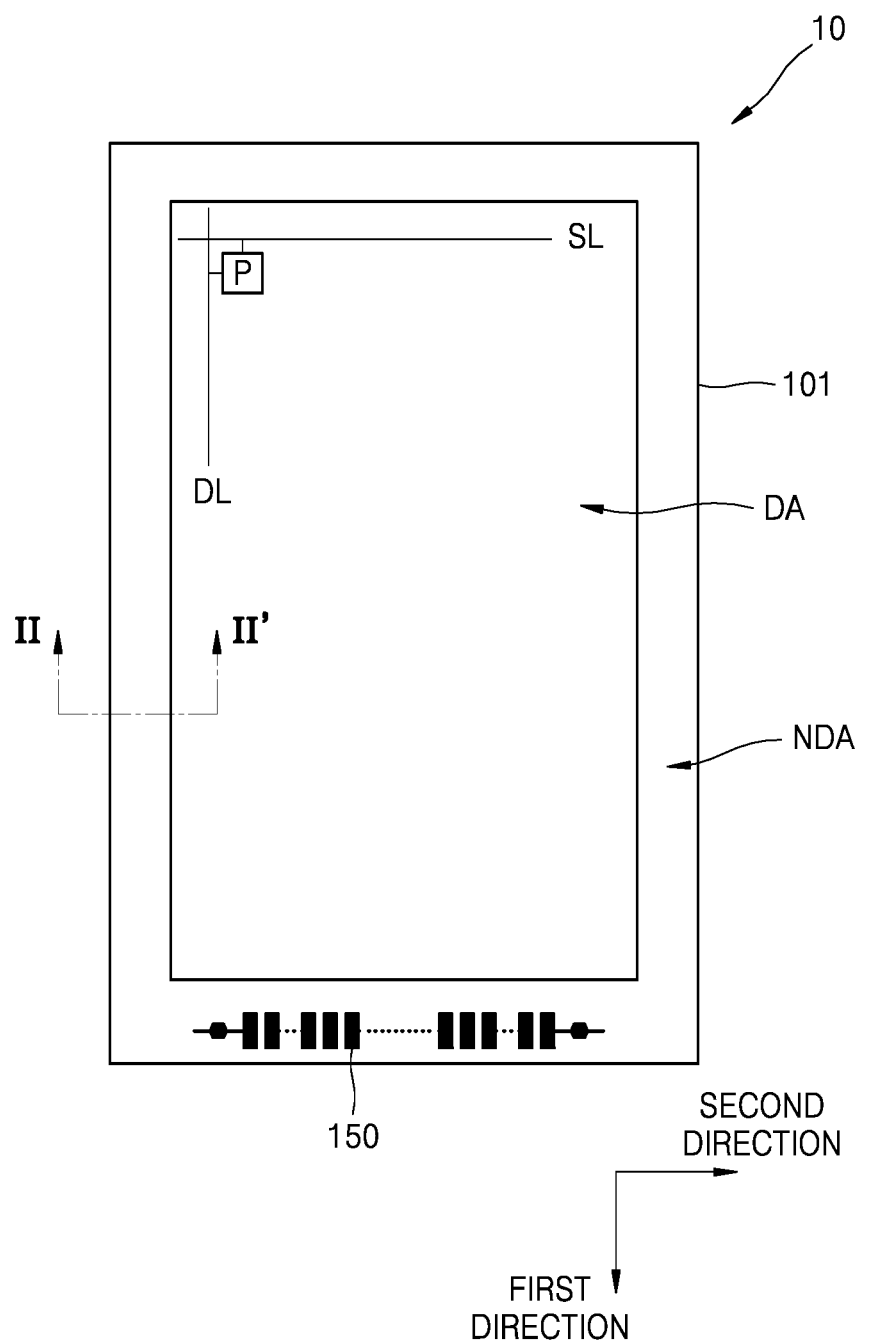
FIG. 1 is a schematic plan view of a display device according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

Since the inventive concept may have diverse modified embodiments, preferred embodiments are illustrated in the drawings and are described in the detailed description. However, this does not limit the inventive concept within specific embodiments and it should be understood that the inventive concept covers all the modifications, equivalents, and replacements within the idea and technical scope of the inventive concept. In the description of the present disclosure, certain detailed explanations of the related art are omitted when it is deemed that they may unnecessarily obscure the essence of the inventive concept.

It will be understood that although the terms "first", "second", etc., may be used herein to describe various components, these components should not be limited by these terms. These components are only used to distinguish one component from another.

The terms used in this application, only certain embodiments have been used to describe, is not intended to limit the present embodiments. As used herein, the singular forms "a", "an", and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

The present disclosure will now be described more fully with reference to the accompanying drawings, in which embodiments of the present disclosure are shown. Like reference numerals in the drawings denote like elements, and thus their repetitive description will be omitted. The drawings may not be to scale. All numerical values are approximate, and may vary. All examples of specific materials and compositions are to be taken as nonlimiting and exemplary only. Other suitable materials and compositions may be used instead.

Figure 2:
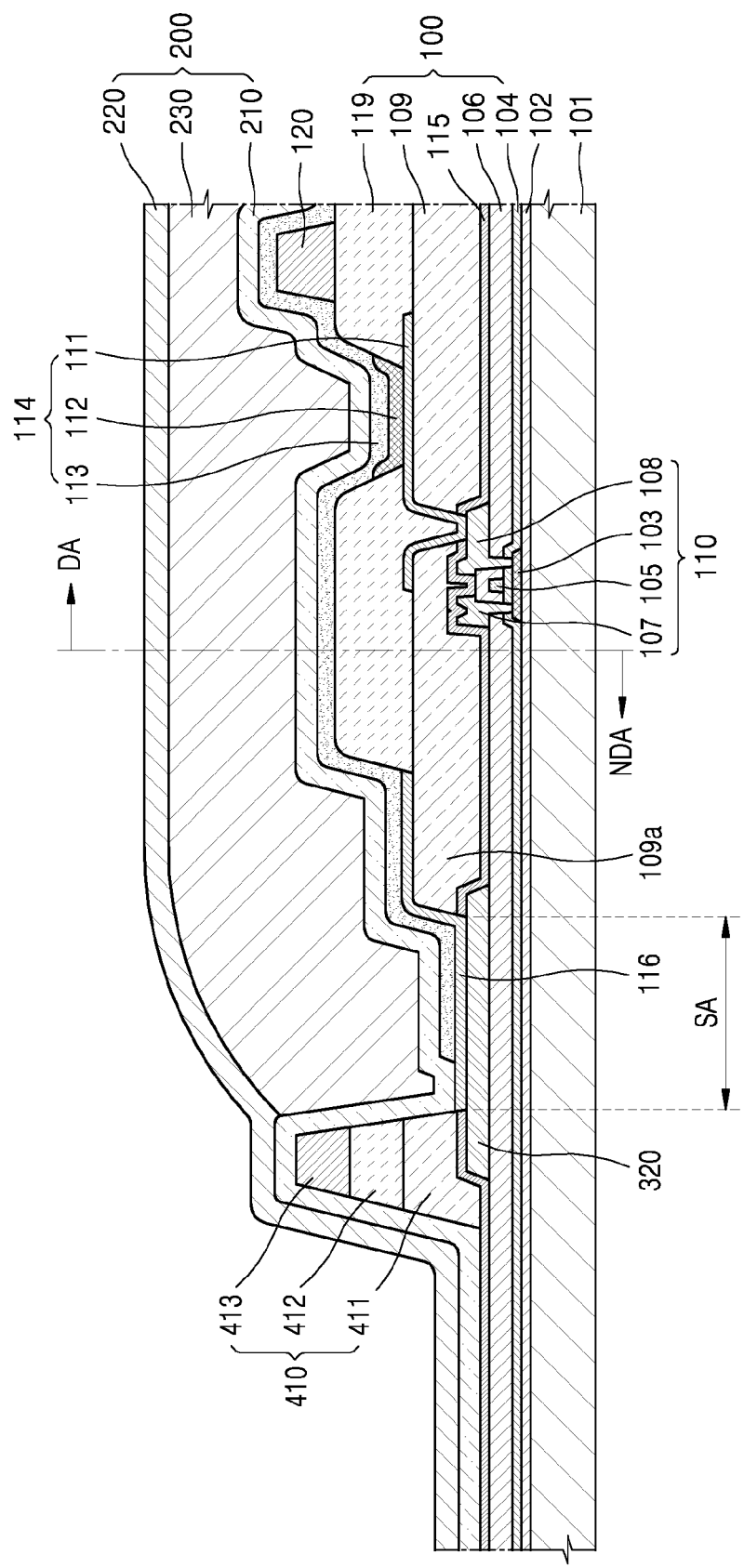
FIG. 2 is a cross-sectional view taken along a line II-II' of FIG. 1.
Figure 3:
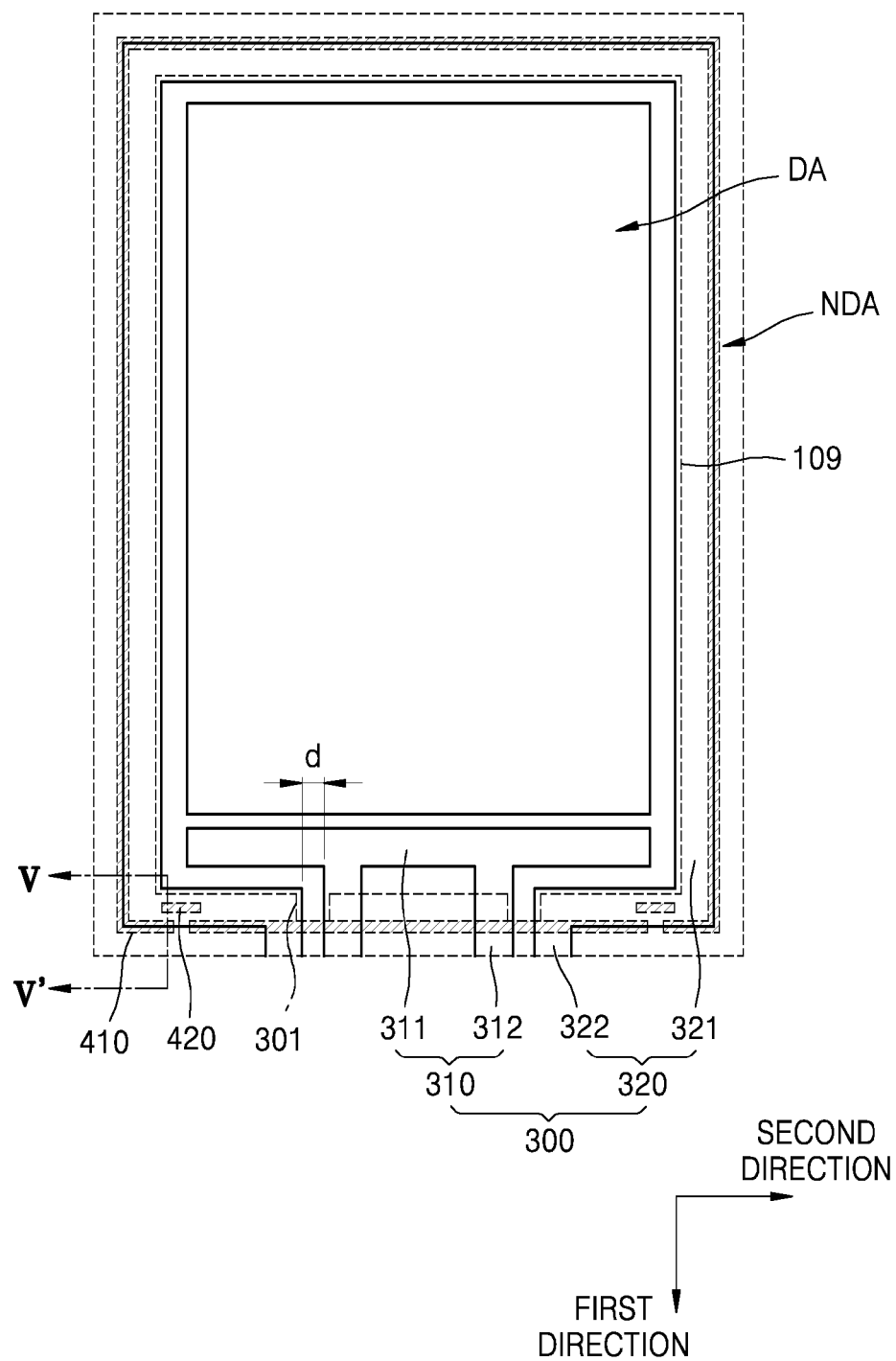
FIG. 3 is a schematic plan view of a planarization film, a voltage supply line, a first blocking dam, and a second blocking dam in the display device of FIG. 1.
Figure 4:
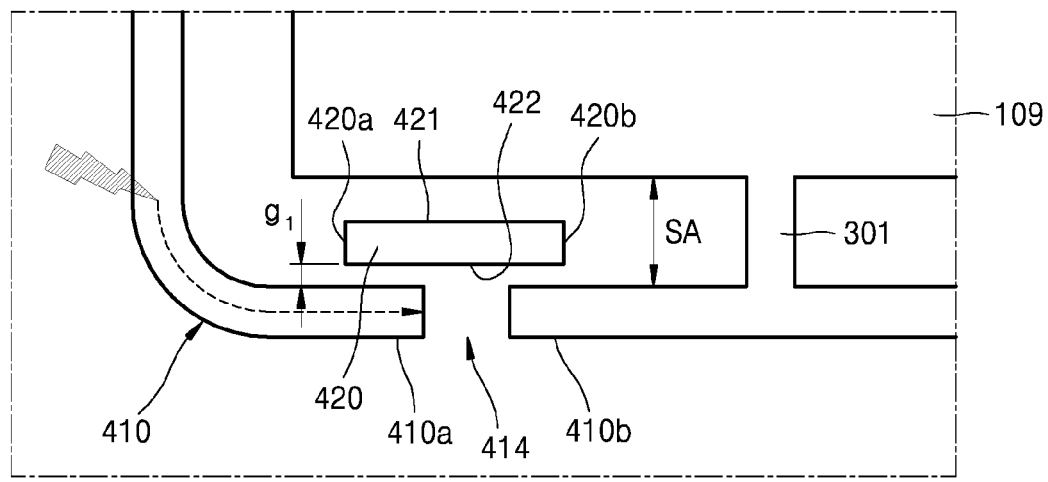
FIG. 4 is an enlarged plan view of the planarization film and the first and second blocking dams of FIG. 3.
Figure 5:
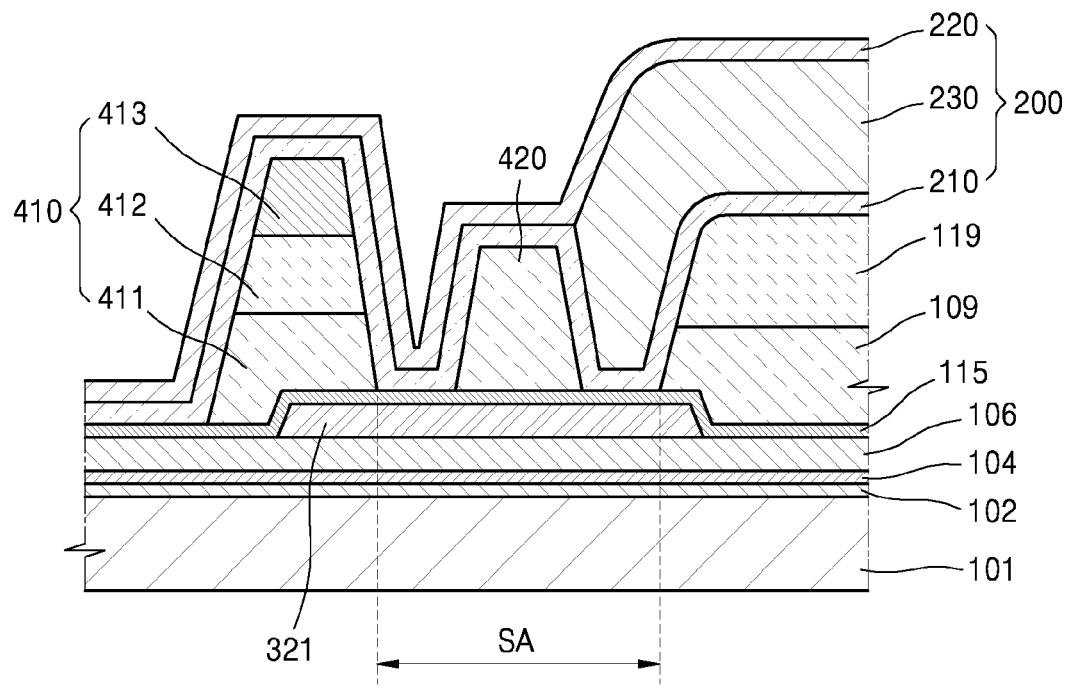
FIG. 5 is a cross-sectional view taken along a line V-V' of FIG. 3.

FIG. 1 is a schematic plan view of a display device 10 according to an embodiment of the present disclosure; FIG. 2 is a cross-sectional view taken along a line II-II' of FIG. 1; FIG. 3 is a schematic plan view of a planarization film 109, a voltage supply line 300, a first blocking dam 410, and a second blocking dam 420 in the display device 10 of FIG. 1; FIG. 4 is an enlarged plan view of the planarization film 109 and the first and second blocking dams 410 and 420 of FIG. 3; and FIG. 5 is a cross-sectional view taken along a line V-V' of FIG. 3.

Referring to FIGS. 1 to 5, the display device 10 may include a substrate 101, a display unit 100 on the substrate 101, and a thin-film encapsulation layer 200 sealing the display unit 100.

The substrate 101 may include various materials. As an example, the substrate 101 may include transparent glass mainly including $SiO_2$. However, the substrate 101 is not limited thereto, and may include transparent plastic materials. Plastic materials may be one of polyethersulphone (PES), polyacrylate (PAR), polyetherimide (PEI), polyethylene napthalate (PEN), polyethylene terephthalate (PET), polypheylene sulfide (PPS), polyarylate, polyimide, polycarbonate (PC), cellulose triacetate (TAC), and cellulose acetate propionate (CAP).

When the display is a bottom-emission type display in which images are directed through the substrate 101, the substrate 101 may include transparent materials. When the display is instead a top-emission type display which directs images away from the substrate 101, the substrate 101 may not include transparent materials. In this latter case, the substrate 101 may for example include metals. For example, the substrate 101 may include copper (Cu), chromium (Cr), manganese (Mn), nickel (Ni), titanium (Ti), molybdenum (Mo), stainless steel (SUS), an invar alloy, an inconel alloy, or a kovar alloy.

The display unit 100 may be disposed on the substrate 101. The substrate 100 may include a display area DA and a non-display area NDA around the display area DA, the display area DA displaying images which a user may recognize.

A plurality of pixels P may be disposed in the display area DA. The pixels P may be disposed near an intersection of a data line DL and a scan line SL. The voltage supply line 300 supplying power to a display element 114 may be disposed in the non-display area NDA. According to an embodiment, a power supply (not shown) or a pad unit 150 transmitting an electrical signal from a signal generator (not shown) to a display area DA may be disposed in the non-display area NDA.

Hereinafter, a structure of the display unit 100 will be described in detail with reference to FIG. 2.

For convenience of description, FIG. 2 illustrates only a driving thin-film transistor represented by a thin-film transistor 110, and a switching thin-film transistor and storage capacitor Cst are not shown even though they may be present.

A buffer layer 102 may be disposed on the substrate 101. The buffer layer 102 may provide a flat surface on the substrate 101, and may block permeation of foreign substances or moisture into the substrate 101. For example, the buffer layer 102 may include an inorganic material such as silicon oxide (SiOx), silicon nitride (SiN), silicon oxynitride (SiON), aluminum oxide ($Al_2O_3$), aluminum nitride (AlN), titanium oxide ($TiO_2$) or titanium nitride (TiON), an organic material such as polyimide, polyester or acryl, or a plurality of laminates thereof.

A thin-film transistor 110, and the display element 114 electrically connected to the thin-film transistor 110, may be disposed on the substrate 101.

The thin-film transistor 110 may include a semiconductor active layer 103, a gate electrode 105, a source electrode 107, and a drain electrode 108. Hereinafter, it is assumed that the thin-film transistor 110 is a top-gate type thin-film transistor, wherein the semiconductor active layer 103, the gate electrode 105, the source electrode 107, and the drain electrode 108 are sequentially formed. However, the present embodiment is not limited thereto, and the thin-film transistor 110 may be of various configurations and types, such as a bottom-gate type transistor.

The semiconductor active layer 103 may include semiconductor materials such as amorphous silicon or polycrystalline silicon. However, the present embodiment is not limited thereto and the semiconductor active layer 103 may include various materials. According to an embodiment, the semiconductor active layer 103 may include organic semiconductor materials. According to another embodiment, the semiconductor active layer 103 may include oxide semiconductor materials. For example, the semiconductor active layer 103 may include an oxide of a material selected from metal elements of Groups 12, 13, and 14, such as zinc (Zn), indium (In), gallium (Ga), tin (Sn), cadmium (Cd), and germanium (Ge), and any combination thereof.

A gate insulating film 104 may be disposed on the semiconductor active layer 103. The gate insulating film 104 may include inorganic materials such as silicon oxides or silicon nitrides, and may include a single layer or multiple layers. According to another embodiment, the gate insulating film 104 may include organic materials and may include a single layer or multiple layers. The gate insulating film 104 may insulate the semiconductor active layer 103 from the gate electrode 105. The gate insulating film 104 may extend to a part of the non-display area NDA as well as the display area DA.

The gate electrode 105 may be disposed on the gate insulating film 104. The gate electrode 105 may be connected to a gate line (not shown) applying on/off signals to the thin-film transistor 110.

The gate electrode 105 may include a low-resistance metal. For example, the gate electrode 105 may include at least one of metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu), and may include a single layer or multiple layers.

An interlayer insulating film 106 may be disposed on the gate electrode 105. The interlayer insulating film 106 may insulate the gate electrode 105 from the source and drain electrodes 107 and 108. The interlayer insulating film 106 may extend to a part of the non-display area NDA as well as the display area DA.

The interlayer insulating film 106 may include inorganic materials and may include a single layer or multiple layers. For example, the inorganic materials may be metal oxides or metal nitrides, and in detail, the inorganic materials may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZrO_2$). According to another embodiment, the interlayer insulating film 106 may include inorganic materials and may include a single layer or multiple layers.

The source and drain electrodes 107 and 108 may be disposed on the interlayer insulating film 106. The source and drain electrodes 107 and 108 may contact a region of the semiconductor active layer 103.

For example, the source and drain electrodes 107 and 108 may include at least one of metals selected from Al, Pt, Pd, Ag, Mg, Au, Ni, Nd, Ir, Cr, Li, Ca, Mo, Ti, W and Cu, and may include a single layer or multiple layers. For example, the source and drain electrodes 107 and 108 may have a three-layered structure of Ti, Al, and Ti.

A passivation film 115 and the planarization film 109 may be disposed on the thin-film transistor 110.

The passivation film 115 may protect the thin-film transistor 110 from impurity during a manufacturing process thereof. The passivation film 115 may include inorganic materials such as $SiO_2$, SiNx, or SiON.

The upper surface of the planarization film 109 is made flat by resolving a step caused by the thin-film transistor 110, and thus, may prevent defects in the display element 114 due to a recess under the display element 114. The planarization film 109 may include organic materials and may include a single layer or multiple layers. The organic materials may include a general polymer such as polymethylmethacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or any blend thereof. According to an embodiment, the planarization film 109 may be a composite laminate of an inorganic insulating film and an organic insulating film.

The display element 114 may be disposed on the planarization film 109. The display element 114 may be an organic light-emitting device including a first electrode 111, a second electrode 113, and an intermediate layer 112 between the first and second electrodes 111 and 113.

The first electrode 111 may be disposed on the planarization film 109 and may be electrically connected to the thin-film transistor 110. The first electrode 111 may have various shapes. For example, the first electrode 111 may be patterned into an island shape.

As one example, the first electrode 111 may be a reflection electrode. As such, the first electrode 111 may include a reflective film formed of Ag, Mg, Al, Pt, Pd, Au, Ni, Nd, Ir, Cr or a compound thereof, and a transparent or semi-transparent electrode layer formed on the reflective film. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The second electrode 113 may be a transparent or semi-transparent electrode, and may include a metal thin-film which has a small work function, e.g. Li, Ca, lithium fluoride (LiF)/Ca, LiF/Al, Al, Ag, Mg or some compound thereof. Furthermore, an auxiliary electrode layer or a bus electrode may further be formed on the metal thin-film by transparent electrode materials such as ITO, IZO, ZnO, or $In_2O_3$. Therefore, the second electrode 113 may transmit light emitted from an organic emission layer included in the intermediate layer 112. The light emitted from the organic emission layer may be emitted to the second electrode 113 directly or after being reflected by the first electrode 111 when it is configured as a reflection electrode.

However, the display unit 100 according to the present embodiment is not limited to a top-emission type configuration, and may be a bottom-emission type display in which the light from the organic emission layer is emitted toward the substrate 101. in this case, the first electrode 111 may include a transparent or semi-transparent electrode, and the second electrode 113 may include a reflection electrode. Furthermore, the display unit 100 according to the present embodiment may be a double-sided emission type display emitting light toward both the front and rear sides of the display unit 100.

A pixel-defining layer 119 may be disposed on the first electrode 111, where the pixel-defining layer 119 includes one or more insulating materials. The pixel-defining layer 119 may include at least one organic insulating material of polyimide, polyamide, acrylic resin, benzocyclobutene (BCB), and phenolic resin, and may be formed by spin coating. The pixel-defining layer 119 may expose a predetermined region of the first electrode 111, and the intermediate layer 112 including an organic emission layer may be disposed on the exposed region. The pixel-defining layer 119 may thus define a pixel region of an organic light-emitting device.

The organic emission layer included in the intermediate layer 112 may include a low-molecular weight organic material or a high-molecular weight organic material. The intermediate layer 112 may further selectively include a functional layer, such as a hole transport layer (HTL), a hole injection layer (HIL), an electron transport layer (ETL), or an electron injection layer (EIL), in addition to the organic emission layer.

A spacer 120 may be disposed on the pixel-defining layer 119. The spacer 120 may include organic materials and may include a single layer or multiple layers. The spacer 120 may be disposed around the pixel region. The spacer 120 may strongly couple or adhere the substrate 101 and the thin-film encapsulation layer 200 to each other. The spacer 120 may protect display characteristics from external impact.

The spacer 120 and the pixel-defining layer 119 may be formed of photosensitive materials by a photographic process or a photolithography process. According to an embodiment, the spacer 120 and the pixel-defining layer 119 may be simultaneously formed by an exposure process wherein an exposure amount is adjusted by a half-tone mask.

The thin-film encapsulation layer 200 may protect the display unit 100 from external oxygen and moisture by sealing the display unit 100. The thin-film encapsulation layer 200 may include at least one of inorganic films 210 and 220, and at least one organic film 230. FIG. 2 illustrates an example of the thin-film encapsulation layer 200 in which organic film 230 is sandwiched between inorganic films 210 and 220. However, the present disclosure is not limited thereto. For example, the thin-film encapsulation layer 200 may further include a plurality of additional inorganic encapsulation films and organic encapsulation films that are alternately laminated, in any number.

The organic film 230 may include at least one metal of acrylic resin, methacrylic resin, polyisoprene, vinyl resin, epoxy resin, urethane resin, cellulosic resin, and perylene resin.

The inorganic films 210 and 220 may include at least one metal of SiNx, AlN, zirconium nitride (ZrN), TiON, hafnium nitride (HfN), tantalum nitride (TaN), SiOx, $Al_2O_3$, $TiO_2$, tin oxide ($SnO_2$), cerium oxide ($CeO_2$), and SiON.

In FIGS. 2 and 3, the voltage supply line 300 may be disposed in the non-display area NDA. The voltage supply line 300 may include a first voltage supply line 310 and a second voltage supply line 320. For example, the first voltage supply line 310 may be a first power voltage (ELVDD) line, and the second voltage supply line 320 may be a second power voltage (ELVSS) line. The second voltage supply line 320 may be connected to the second electrode 113. FIG. 2 illustrates an example in which the second voltage supply line 320 and the second electrode 113 are connected to each other via a wiring 116. However, the present disclosure is not limited thereto, and the second voltage supply line 320 and the second electrode 113 may instead be directly connected to each other.

The first voltage supply line 310 may include a first main line 311 and a first connection line 312 arranged corresponding to a side of the display area DA.

When the display area DA is shaped as a rectangle, the first main line 311 may be disposed to correspond to any one side of the display area DA. The first main line 311 may be disposed parallel with any one side of the display area DA. The any one side corresponding to the first main line 311 may be adjacent to the pad unit 150.

The first connection line 312 may extend from the first main line 311 in a first direction. The first direction may be a direction from the display area DA to the pad unit 150, and the first connection line 312 may be electrically connected to the pad unit 150. A part of the first connection line 312 may be exposed.

The second voltage supply line 320 may include a second main line 321 and a second connection line 322, the second main line 321 surrounding remaining areas of the display area DA with both ends of the first main line 311 and the second connection line 322 extending from the second main line 321 in the first direction. The second connection line 322 may be electrically connected to the pad unit 150. A part of the first connection line 322 may be exposed.

The first and second connection lines 321 and 322 may be disposed spaced apart from each other in a second direction. The first and second connection lines 321 and 322 may be separated from each other by an interval d.

According to an embodiment, the voltage supply line 300 may be formed of the same materials as those of the source and drain electrodes 107 and 108. For example, the voltage supply line 300 may have a layered structure with a first layer including Ti, a second layer including Al, and a third layer including Ti. A side surface of the voltage supply line 300 may be covered by the passivation film 115.

At least one layer of the first blocking dam 410 may be disposed outside the display area DA. The first blocking dam 410 may surround the display area DA. When forming the organic film 230 of the thin-film encapsulation layer 200 to seal the display unit 100, the first blocking dam 410 may block organic materials from flowing in a direction along an edge of the substrate 101, and may prevent formation of an edge tail of the organic film 230. According to an embodiment, the first blocking dam 410 may cover an outer edge of the second main line 321.

The first blocking dam 410 may have at least one layer. According to an embodiment, the first blocking dam 410 may include a first dam portion 411, a second dam portion 412 disposed on the first dam portion 411, and a third dam portion 413 disposed on the second dam portion 412. The first to third dam portions 411 to 413 may be successively laminated in a direction perpendicular to the substrate 101.

The first dam portion 411 may be at the same layer as the planarization film 109. The first dam portion 411 may be formed of the same material as that of the planarization film 109 by an identical process. The second dam portion 412 may be at the same layer as the pixel-defining layer 119. The second dam portion 412 may be formed of the same material as that of the pixel-defining layer 119 by an identical process. The third dam portion 413 may be at the same layer as the spacer 120. The third dam portion 413 may be formed of the same material as that of the spacer 120 by an identical process.

Although a three-layered first blocking dam 410 is described as an example, the first blocking dam 410 is not limited thereto. The first blocking dam 410 may have one of at least one layer of an organic film structure, at least one layer of an inorganic film structure, and a laminated structure including at least one layer of an organic film and at least one layer of an inorganic film.

According to an embodiment, the first blocking dam 410 may be plural in number. That is, a plurality of first blocking dams 410 may be disposed spaced apart from one another in a direction parallel to the substrate 101. When the first blocking dam 410 includes a plurality of dams, a height of the first blocking dam 410 may increase toward an edge of the substrate 101.

When forming the organic film 230 of the thin-film encapsulation layer 200, the first blocking dam 410 may block organic materials from flowing in a direction along an edge of the substrate 101, and thus the organic film 230 may be disposed inside the first blocking dam 410. Meanwhile, the inorganic films 210 and 220 of the thin-film encapsulation layer 200 may be wider than the organic film 230. The inorganic films 210 and 220 may cover an outer surface of the first blocking dam 410. The inorganic films 210 and 220 may contact each other outside the first blocking dam 410. The thin-film encapsulation layer 200 may be connected to the first blocking dam 410.

According to an embodiment, a separation area SA not having an organic film may be disposed between at least one organic layer disposed on the display area DA and the first blocking dam 410. For example, the planarization film 109 may be disposed on the display area DA. The planarization film 109 may extend a predetermined distance outside the display area DA. According to an embodiment, an end 109a of the planarization film 109 may cover an inner edge of the second main line 321.

The separation area SA may be disposed between the end 109a of the planarization film 109 and the first blocking dam 410. The separation area SA may prevent permeation of outside air or moisture into the display area DA through the planarization film 109 (which may be formed of organic materials).

According to an embodiment, the organic film disposed on the display area DA is not limited to the planarization film 109 as long as the organic film, which may include e.g. the pixel-defining layer 119, is arranged on each of elements disposed on the display area DA. The organic film disposed on the display area DA may have a structure including a single layer or multiple layers.

Meanwhile, the interval d may be between the first connection line 312 of the first voltage supply line 310 and the second connection line 322 of the second voltage supply line 320 in. In order to cover the interval d, a connector 301 connecting the planarization film 109 and the first blocking dam 410 may be disposed in the interval d. The connector 301 may cross the separation area SA not having the organic film. According to an embodiment, if there are a plurality of intervals between the first and second voltage supply lines 310 and 320 to which different voltages are respectively applied, the connector 301 may be disposed in each of the intervals by crossing the separation area SA.

When the first blocking dam 410 is damaged, such as by impact, static electricity, or damage to the thin film encapsulation layer 200, the first blocking dam 410 may be a route through which outside air or moisture permeates. The outside air or moisture may permeate into the display area DA through the connector 301 located in the interval d. Therefore, pixel shrinkage may occur in the display area DA.

In order to block a permeation route of the outside air or moisture, at least a part of the first blocking dam 410 may be removed, and thus, the divided pieces of the first blocking dam 410 may be spaced apart from each other. In other words, a spaced part 414, or gap, may be formed between an end 410a of the first blocking dam 410 and the other end 410b of the first blocking dam 410. The spaced part 414 may correspond to a portion where a part of the first blocking dam 410 surrounding the display area DA is removed. According to an embodiment, the spaced part 414 may be an area where at least one layer of organic films forming the first blocking dam 410 is removed.

Therefore, as shown in FIG. 4, even if external impact is applied to the display device 10, outside air or moisture flowing along the first blocking dam 410 may be blocked by the end 410a of the first blocking dam 410 as shown by a dashed line, and thus, the outside air or moisture may not permeate into the display area DA.

Meanwhile, the second blocking dam 420 may be disposed in front of the spaced part 414 to prevent organic materials of the thin-film encapsulation layer 200 from flowing into the spaced part 414.

According to an embodiment, the second blocking dam 420 may be disposed in the separation area SA. The second blocking dam 420 may be disposed between an organic film, for example, the planarization film 109 covering the display area DA and the first blocking dam 410. The first blocking dam 410 and the second blocking dam 420 may be spaced apart from each other by a predetermined distance $g_1$.

A first sidewall 421 of the second blocking dam 420 may face the planarization film 109 disposed on the display area DA. A second sidewall 422 of the second blocking dam 420 may face the first blocking dam 410 having the spaced part 414. According to an embodiment, the second blocking dam 420 may be disposed in front of the first blocking dam 410 and may have an island shape.

The second blocking dam 420 may be longer than the spaced part 414 to fully cover the spaced part 414. An end 420a of the second blocking dam 420 may overlap the end 410a of the first blocking dam 410, and the other end 420b of the second blocking dam 420 may overlap the other end 410b of the first blocking dam 410. Thus, the spaced part 414 may be blocked or completely covered between the end 420a and the other end 410b of the second blocking dam 420.

The second blocking dam 420 may be at the same layer as at least one of the organic films disposed in the display area DA. According to an embodiment, the second blocking dam 420 may be at the same layer as the planarization film 109. The second blocking dam 420 may be formed of the same material as that of the planarization film 109 by an identical process.

According to an embodiment, the second blocking dam 420 may be formed with a structure including a multilayer lamination of the planarization film 109 and the pixel-defining layer 119.

According to an embodiment, although it is described as an example that the second blocking dam 420 has at least one layer of an organic film structure, the second blocking dam 420 is not limited thereto. The second blocking dam 420 may have one of at least one layer of an organic film structure, at least one layer of an inorganic film structure, and a laminated structure including at least one layer of an organic film and at least one layer of an inorganic film.

According to an embodiment, the second blocking dam 420 may be disposed on a first voltage supply line 310 or a second voltage supply line 320.

Figure 7:
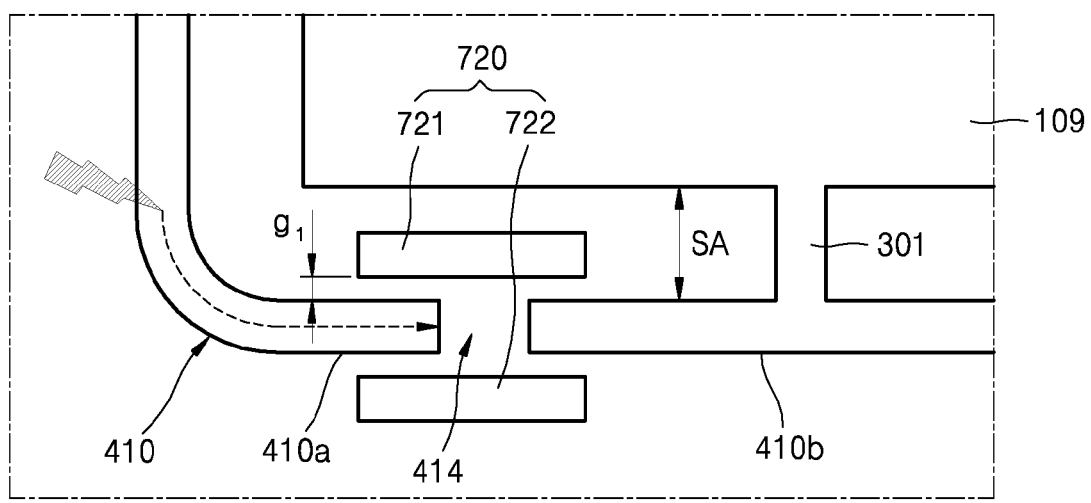
FIG. 7 is a variation of FIG. 4.

According to an embodiment, the second blocking dam 420 may be disposed in at least one of a front portion and a rear portion of the first blocking dam 410. For example, as shown in FIG. 7, a second blocking dam 720 may be disposed in both of the front portion and the rear portion of the first blocking dam 410. The second blocking dam 720 may include a first dam portion 721 disposed between the planarization film 109 and the first blocking dam 410, and a second dam portion 722 disposed outside the first blocking dam 410.

Figure 6:
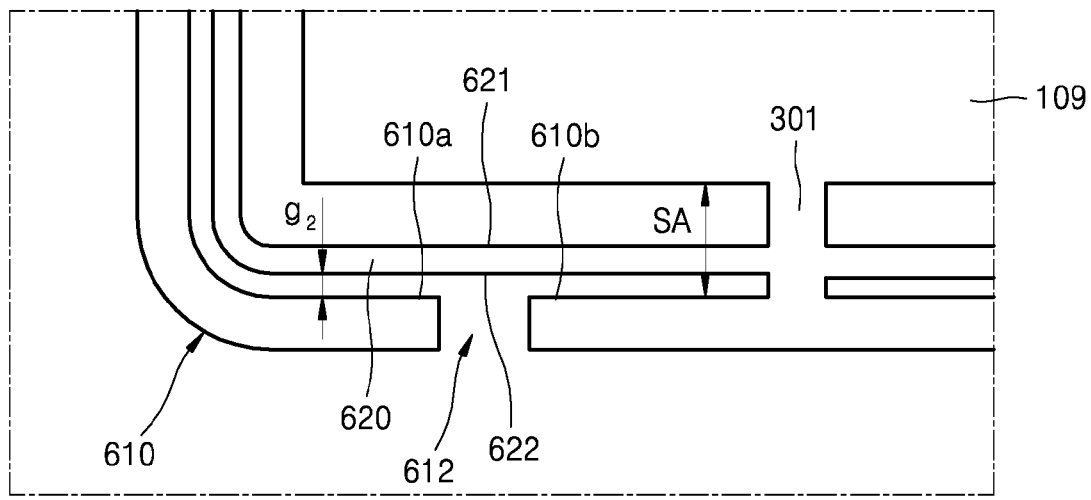
FIG. 6 is an enlarged plan view of a planarization film and first and second blocking dams according to another embodiment of the present disclosure.

FIG. 6 is an enlarged plan view of the planarization film 109, and first and second blocking dams 610 and 620, according to another embodiment of the present disclosure.

Hereinafter, like reference numerals in FIGS. 1 to 6 denote like elements, and therefore, any repetitive description is omitted.

Referring to FIG. 6, the separation area SA not having an organic film may be disposed between an organic film, for example the planarization film 109 covering the display area DA (of FIG. 3), and the first blocking dam 610. The connector 301 may be disposed between the planarization film 109 and the first blocking dam 610. The connector 301 may cross the separation area SA.

According to an embodiment, the planarization film 109, the first blocking dam 610, and the connector 301 may include organic films.

According to an embodiment, the first blocking dam 610 may have one of at least one layer of an organic film structure, at least one layer of an inorganic film structure, and a laminated structure including at least one layer of an organic film and at least one layer of an inorganic film.

At least a part of the first blocking dam 610 may be removed, and thus, the divided pieces of the first blocking dam 610 may be spaced apart from each other. A spaced part or gap 612 may be formed between an end 610a of the first blocking dam 610 and the other end 610b of the first blocking dam 610. The interval 612 may correspond to a portion where a part of the first blocking dam 610 is removed. According to an embodiment, the spaced part 612 may be an area where at least one layer of organic films forming the first blocking dam 610 is removed.

The second blocking dam 620 may be disposed in front of the spaced part 612. According to an embodiment, the second blocking dam 620 may be disposed in at least one of a front portion and a rear portion of the first blocking dam 610. Unlike the embodiment of FIG. 4, the second blocking dam 620 may be formed in a belt or other shape substantially surrounding the display area DA. A shape of the second blocking dam 620 may correspond to a shape of the first blocking dam 610. The second blocking dam 620 may be connected to the connector 301. According to an embodiment, the second blocking dam 620 may be formed as an open loop wherein at least a part is opened, or as a closed loop completely surrounding the display area DA.

According to an embodiment, the second blocking dam 620 may have one of at least one layer of an organic film structure, at least one layer of an inorganic film structure, and a laminated structure including at least one layer of an organic film and at least one layer of an inorganic film.

The second blocking dam 620 may be disposed in the separation area SA. The second blocking dam 620 may be disposed between the planarization film 109 and the first blocking dam 610. A first sidewall 621 of the second blocking dam 620 may face the planarization film 109. A second sidewall 622 of the second blocking dam 620 may face the first blocking dam 610 having the spaced part 612. The first blocking dam 610 and the second blocking dam 620 may be spaced apart from each other by a predetermined distance $g_2$.

Since the first blocking dam 610 includes the spaced part 612, the first blocking dam 610 may block permeation or infiltration of outside air or moisture into the display area DA. Since the second blocking dam 620 surrounds the display area DA, the second blocking dam 620 may block the organic materials of the thin-film encapsulation layer (of FIG. 2) from flowing outside the first blocking dam 610.

A display device according to an exemplary embodiment of the present disclosure may block a permeation or infiltration route of outside air or moisture into a display area as at least a part of a first blocking dam is removed, and thus, the divided pieces of the first blocking dam are spaced apart from each other. Furthermore, since a second blocking dam is disposed in at least one of a front portion or a rear portion of the gaps in the first blocking dam, the second blocking dam may prevent organic materials of a thin-film encapsulation layer from flowing into the spaced part.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims. Various features of the above described and other embodiments can thus be mixed and matched in any manner, to produce further embodiments consistent with the invention.

What is claimed is:

1. A display device comprising:
   a substrate comprising a display area and a non-display area surrounding the display area;
   a thin-film encapsulation layer disposed on the substrate; and
   a first blocking dam disposed outside the display area and surrounding the display area, wherein the first blocking dam has a laminated structure including at least one layer of an organic film and at least one layer of an inorganic film;
   wherein portions of the first blocking dam are spaced apart from each other with a gap therebetween,
   wherein a second blocking dam is disposed between the display area and a front portion of the gap in the first blocking dam, a first sidewall of the second blocking dam faces the display area, and a second sidewall of the second blocking dam faces the gap in the first blocking dam;

wherein the second blocking dam has a length greater than the gap, with one end of the second blocking dam overlapping a first end of the first blocking dam adjacent to one end of the gap, and an opposing end of the second blocking dam overlapping a second end of the first blocking dam adjacent to an opposing end of the gap, so that the second blocking dam extends beyond both the one end of the gap and the opposing end of the gap; and wherein the second blocking dam has a laminated structure including at least one layer of an organic film and at least one layer of an inorganic layer.

2. The display device of claim 1, wherein the second blocking dam has an island shape.

3. The display device of claim 1, wherein the second blocking dam surrounds the display area.

4. The display device of claim 1, wherein the second blocking dam is also disposed at a rear portion of the first blocking dam.

5. The display device of claim 1, wherein the display area comprises:
- a thin-film transistor comprising a semiconductor active layer, a gate electrode, a source electrode, and a drain electrode, and
- at least one organic film, a plurality of voltage supply lines is disposed in the non-display area,
at least one organic film is disposed on the display area, and
the first and second blocking dams are spaced apart from each other.

6. The display device of claim 5, wherein
the voltage supply lines comprise first and second voltage supply lines to which different voltages are respectively applied,
the first and second voltage supply lines have an interval therebetween, and
a connector configured to connect the organic film and the first blocking dam is disposed in the interval.

7. The display device of claim 6, wherein
the connector is configured to cross a separation area not having the organic film.

8. The display device of claim 7, wherein
the second blocking dam is disposed in the separation area.

9. The display device of claim 8, wherein
the second blocking dam is disposed between the organic film and the first blocking dam,
a first sidewall of the second blocking dam faces the organic film, and
a second sidewall of the second blocking dam faces the gap in the first blocking dam.

10. The display device of claim 6, wherein
the first voltage supply line comprises a first main line corresponding to the display area, and a first connection line extending from the first main line in a first direction,
the second voltage supply line comprises a second main line surrounding remaining areas of the display area, and a second connection line extending from the second main line in the first direction, and
the interval is positioned between the first and second connection lines.

11. The display device of claim 5, wherein
the second blocking dam has an island shape.

12. The display device of claim 5, wherein
the second blocking dam surrounds the display area.

13. The display device of claim 5, wherein
the first blocking dam comprises a same material as that of at least one of a gate insulating layer, an interlayer insulating layer, a planarization film, a pixel-defining layer, and a spacer, and
the organic films are laminated successively in a direction perpendicular to the substrate.

14. The display device of claim 13, wherein
the second blocking dam is at the same layer as at least one of the gate insulating layer, the interlayer insulating layer, the planarization film, the pixel-defining layer, and the spacer.

* * * * *